(12) United States Patent
Sauer

(10) Patent No.: US 9,876,410 B2
(45) Date of Patent: Jan. 23, 2018

(54) ELECTRIC MOTOR WITH FUNCTIONAL MONITORING OF THE MOTOR BEARINGS

(71) Applicant: Dipl.-Ing. Thomas Sauer, Bad Mergentheim (DE)

(72) Inventor: Dipl.-Ing. Thomas Sauer, Bad Mergentheim (DE)

(73) Assignee: EBM-PAPST MULFINGEN GmbH & Co. KG (DE)

( * ) Notice: Subject to any disclaimer, the term of this patent is extended or adjusted under 35 U.S.C. 154(b) by 318 days.

(21) Appl. No.: 14/772,993

(22) PCT Filed: Mar. 13, 2014

(86) PCT No.: PCT/EP2014/054929
§ 371 (c)(1),
(2) Date: Sep. 4, 2015

(87) PCT Pub. No.: WO2014/140155
PCT Pub. Date: Sep. 18, 2014

(65) Prior Publication Data
US 2016/0020677 A1     Jan. 21, 2016

(30) Foreign Application Priority Data
Mar. 14, 2013 (DE) .......................... 10 2013 102 648

(51) Int. Cl.
    *H02K 11/00*         (2016.01)
    *H02K 5/16*          (2006.01)
    (Continued)

(52) U.S. Cl.
    CPC .......... *H02K 5/161* (2013.01); *G01R 31/343* (2013.01); *H02K 5/1675* (2013.01); *H02K 5/24* (2013.01); *H02K 11/20* (2016.01); *H02K 11/33* (2016.01)

(58) Field of Classification Search
    CPC ........ H02K 11/20; H02K 11/21; H02K 11/24; H02K 11/25
(Continued)

(56) References Cited

U.S. PATENT DOCUMENTS 5,629,870 A     5/1997     Farag et al.
5,726,911 A     3/1998     Canada et al.
(Continued)

FOREIGN PATENT DOCUMENTS

DE     103 13 273 A1     10/2004

OTHER PUBLICATIONS

International Preliminary Report on Patentability for corresponding PCT/EP2014/054929; search carried out on Jan. 30, 2015.
(Continued)

*Primary Examiner* — Jeremy Luks
(74) *Attorney, Agent, or Firm* — Tarolli, Sundheim, Covell & Tummino LLP

(57) ABSTRACT

The present invention relates to an electric motor, comprising a stator and a rotor that can rotate relative to the stator and that is mounted in bearing arrangements, and also comprising a motor housing and a vibration sensor to pick up vibrations that occur in the electric motor and that are caused by malfunctions of the bearing arrangements. The configuration provided here is that of an external-rotor motor. The stator has a bearing support tube that is connected at one end to a ring-shaped stator flange. Bearing arrangements are arranged at a distance from each other in the bearing support tube in the direction of a center longitudinal axis of the bearing support tube, in which a shaft of the rotor is supported. The vibration sensor is attached to the stator flange.

7 Claims, 1 Drawing Sheet

(51) Int. Cl.
   *G01R 31/34*    (2006.01)
   *H02K 5/167*    (2006.01)
   *H02K 5/24*     (2006.01)
   *H02K 11/20*    (2016.01)
   *H02K 11/33*    (2016.01)

(58) Field of Classification Search
   USPC .......................................... 310/51, 90, 68 B
   See application file for complete search history.

(56) References Cited

U.S. PATENT DOCUMENTS

| | | | |
|---|---|---|---|
| 7,126,243 B2* | 10/2006 | Kawasaki | B64G 1/32 |
| | | | 310/51 |
| 9,431,880 B2* | 8/2016 | Sun | H02K 11/25 |
| 2008/0197797 A1* | 8/2008 | El-Ibiary | H02P 5/00 |
| | | | 318/567 |
| 2008/0290761 A1* | 11/2008 | Eckert | H02K 11/20 |
| | | | 310/68 B |
| 2010/0085002 A1* | 4/2010 | Knauff | H02K 11/35 |
| | | | 318/490 |
| 2012/0181965 A1 | 7/2012 | Chamberlin et al. | |

OTHER PUBLICATIONS

International Search Report for corresponding PCT/EP2014/054929 dated Jul. 7, 2014; dated Jun. 27, 2014 by Ali Kerem Dogueri.
Lee, et al., "Acoustic Resonance of Outer-Rotor Brushless DC Motor for Air-Conditioner Fan", Journal of Applied Physics, 103, 07F116 (2008), DOI:http://dx.doi.org/10.1063/1.2838327.

* cited by examiner

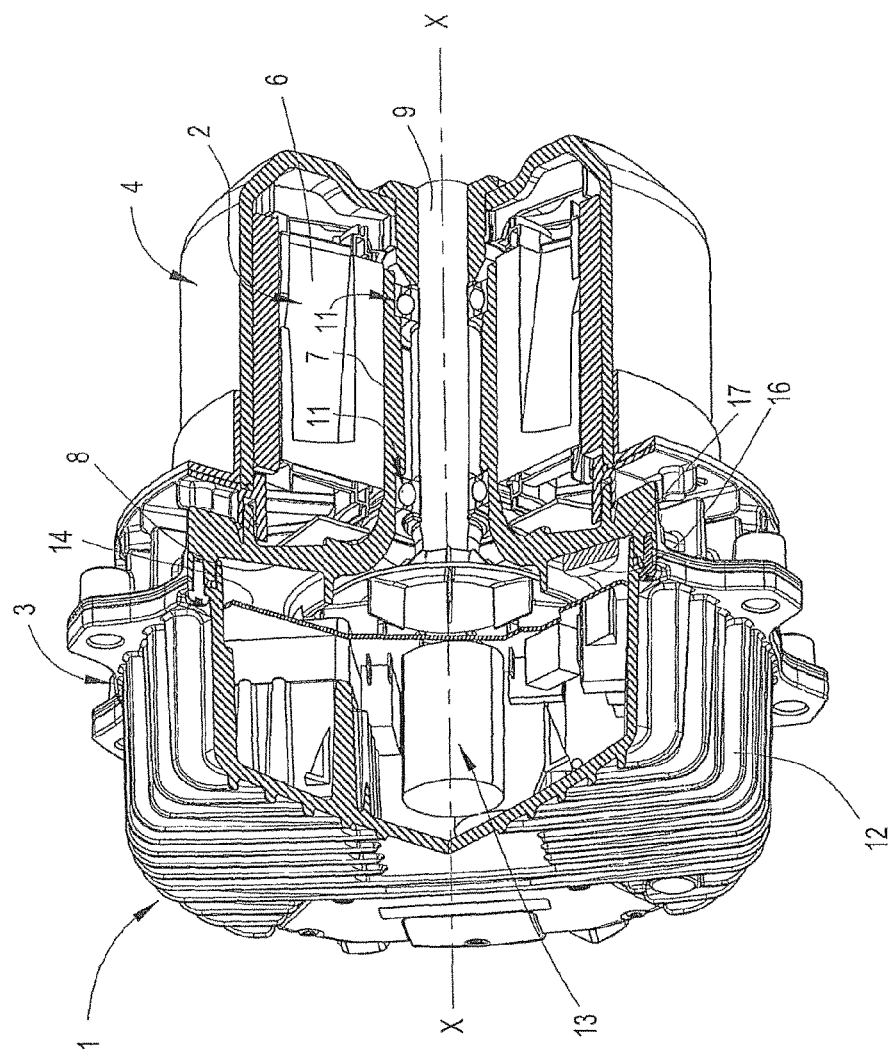

ELECTRIC MOTOR WITH FUNCTIONAL MONITORING OF THE MOTOR BEARINGS

RELATED APPLICATIONS

The present invention is a U.S. National Stage under 35 USC 371 patent application, claiming priority to Serial No. PCT/EP2014/054929, filed on 13 Mar. 2014; which claims priority from DE102013102648.6, filed 14 Mar. 2013, the entirety of both of which are incorporated herein by reference.

TECHNICAL FIELD

The present invention relates to an electric motor, comprising a stator and a rotor that can rotate relative to the stator and that is mounted in bearings, and also comprising a motor housing and a vibration sensor to pick up vibrations that occur in the electric motor and that are caused by malfunctions of the bearings.

BACKGROUND

In industry, widespread use is made of systems in which one or more vibration sensors or vibration rate sensors are installed on the outside of the housing of the motor that is to be monitored. In this context, reference can be made to U.S. Pat. No. 5,629,870. Here, the signal of the sensor is evaluated by a separate electronic unit and the operator is provided with a signal that can associate the measured vibrations with the various causes of malfunction. This calls for quite complex circuitry and an unwanted susceptibility to malfunction. Such an arrangement is also known from U.S. Pat. No. 5,726,911.

SUMMARY

The present invention is based on the objective of starting with a generic electric motor and improving it in such a way that a reliable function monitoring of the bearings of the motor can be achieved cost-effectively and involving very few resources in terms of components and circuitry.

According to the invention, this is achieved in that the electric motor is configured as an external-rotor motor in which the stator has a bearing support tube that is connected at one end to a ring-shaped stator flange, and bearing arrangements are arranged at a distance from each other in the bearing support tube in the direction of a center longitudinal axis of the bearing support tube, in which a shaft of the rotor is supported, and the vibration sensor is attached to the stator flange on the side facing away from the rotor. The vibration sensor is preferably configured as a vibration rate sensor, whereby it can be, for instance, a laser-Doppler vibrometer, a MEMS (micro-electro-mechanical system) based on a semiconductor, or else a piezoelectric sensor. Advantageously, the vibration sensor is attached directly to a free surface of the stator flange that immediately adjoins the bearing support tube in the radial direction relative to the longitudinal axis. Here, the stator flange and the bearing support tube are especially configured in one piece. Consequently, according to the invention, the two bearings arranged in the bearing support tube can be monitored simultaneously by the same vibration sensor. Of course, it cannot be distinguished with certainty which of the two bearings has sustained the damage, but this does not lead to an impairment of the system function since the entire electric motor has to be replaced anyway because the bearings that are typically installed with a press fit in the bearing support tube as an interference-fit bearing cannot be replaced on site anyway. A motor according to the invention can especially be used to drive fans, whereby this is a mass-produced item for which it is particularly important to find a cost-effective solution that is not prone to failure. The electric motor according to the invention is preferably a brushless external-rotor motor with integrated electronics, whereby the electronics are advantageously arranged in a partial housing that is attached to the stator flange on its side facing away from the rotor. The vibration sensor according to the invention is also arranged in this housing.

Since the sensor is arranged according to the invention in such a way that it is just at a very short distance from the bearings, the transmission of high-frequency structure-borne sound components is quite readily possible.

BRIEF DESCRIPTION OF THE DRAWINGS

Advantageous embodiments of the invention are contained in the subordinate claims and are explained in greater detail with reference to the embodiment shown in the accompanying drawing. The following is shown:

FIG. 1 a perspective view of an electric motor according to the invention, in a partially cutaway view.

DETAILED DESCRIPTION

If certain features of the electric motor according to the invention that are described in and/or that can be gleaned from the drawing are only described in conjunction with one or more features, they are nevertheless likewise essential according to the invention, irrespective of said embodiment, either as an individual feature or else in combination with other features of the embodiment, and are claimed as belonging to the invention.

The electric motor 1 shown in FIG. 1 is preferably configured as an electronically commuted, direct-current external-rotor motor without a collector. The electric motor 1 consists of a stator 2 and of a rotor 4 that is configured as an external rotor and that surrounds the stator 2 like a pot from one side as part of a motor housing 3. The stator 2 consists of a stator laminated core 6 with individual stator windings (not shown in greater detail here) that are especially configured as a single-tooth winding. The stator 2 has a bearing support tube 7 that runs inside the stator laminated core 6 and a center longitudinal axis X-X. A stator flange 8 is attached to the bearing support tube 7 on one side and this stator flange and the bearing support tube 7 are preferably configured in one piece. The stator flange 8 is ring-shaped. The rotor 4 is rotatably mounted 1 in the bearing support tube 7 via a shaft 9 and via bearing arrangements 11. The bearing arrangements 11 are installed with a press fit inside the bearing support tube 7 and they are at a distance from each other in the axial direction. On the side of the stator flange 8 facing away from the rotor 4, as another part of the motor housing 3, there is an adjoining partial housing 12 that serves to accommodate motor electronics 13 of which individual electronic components are arranged on a printed circuit board 14.

According to the invention, inside the partial housing 12, the stator flange 8 has a vibration sensor 16 on its side facing away from the rotor 4. This vibration sensor 16 is preferably configured as a vibration rate sensor, whereby it can be, for instance, a laser-Doppler vibrometer, a MEMS (micro-electro-mechanical system) based on a semiconductor, or else a piezoelectric sensor. The vibration sensor 16 is preferably attached directly to a free surface 17 of the stator flange 8, said surface immediately adjoining the bearing support tube 7 in the radial direction relative to the longitudinal axis X-X. This can be a free surface 17 that, as shown in FIG. 1, is arranged opposite from the printed circuit board 14, or else it can be a free surface 17 on the side opposite from the stator 6. This translates into only a short distance to the bearing arrangements 11, so that the transmission of high-frequency structure-borne sound components is possible. Particularly since the stator flange 8 and the bearing support tube 7 are configured in one-piece according to the invention, the vibration rate of the two bearing arrangements 11 can be picked up with one single sensor. The vibration sensor 16 is connected via a signal cable (not shown here) to evaluation electronics (likewise not shown here) that are arranged on the printed circuit board 14. The direct proximity of the vibration sensor 16 according to the invention to the printed circuit board 14 and to the motor electronics 13 arranged on the printed circuit board translates into a compact and cost-effective design. Here, in order to cut down on additional system costs, it is possible to use the calculating function that is needed to implement the commuting electronics arranged on the printed circuit board 14, and this is done in that the bearing failure data is calculated as a very slow mathematical function in the main program of the processor that is already present for the commuting electronics. However, according to the invention, it is also possible to provide a dedicated processor for the evaluation of the signals generated by the vibration sensor 16, whereby this processor would likewise be arranged on the printed circuit board 14, and it could use, for instance, the low-voltage part of the motor electronics 13, as well as the existing EMC filter and many other components. Moreover, it can be practical according to the invention if a metal structure-borne sound-conducting element, for example, in the form of a preferably round disc, is arranged between the vibration sensor 16 and the stator flange 8. Such a structure-borne sound-conducting element can serve to set the precise distance between the stator flange 8 and the printed circuit board 14, or else to additionally permit the electric signal cable leading to the sensor transport to be inserted at an optimal location. The signal cable leading to the vibration sensor 16 can be laid via the back or side surface of the vibration sensor 16.

If a system contains several electric motors 1 according to the invention that are mechanically coupled within the system, it can be advantageous to prevent a mutual influencing of the sensor values measured by the individual vibration sensors 16 in that the individual electric motors 1 are uncoupled from each other in terms of vibrations. This can be done, for example, in the area of the stator flange 8 or else, for instance, in the case of axial fans that have an electric motor 1 according to the invention, on an external protective grid holder of the fan in question.

According to the invention, an electric motor 1 is being put forward in which the vibration sensor 16 is completely integrated into the motor. Since only one sensor is needed for the measurement, the costs incurred are minimal, and owing to the arrangement in the immediate vicinity of the motor electronics, the possibility exists to use the already present electronic components for multiple purposes.

The invention is not limited to the embodiments shown and described, but rather, it encompasses all embodiments that have the same effect as set forth in the invention. Moreover, the invention is not, in fact, limited to the feature combinations defined in the claims, but rather, it can also be defined by any other combination of certain features of all individual features that have been altogether disclosed. This means that fundamentally speaking, practically any individual feature can be left out or can be replaced by at least one individual feature disclosed in another place of the application. Consequently, the claims are only to be understood as an initial attempt at formulating an invention.

LIST OF REFERENCE NUMERALS 1 electric motor
2 stator
3 motor housing
4 rotor
6 laminated core
7 bearing support tube
8 stator flange
9 shaft
11 bearing arrangements
12 partial housing
13 motor electronics
14 printed circuit board
16 vibration sensor
17 free surface
X-X longitudinal axis

The invention claimed is:

1. An electric motor, comprising a stator and a rotor that can rotate relative to the stator and that is mounted in bearing arrangements, and also comprising a motor housing and a vibration sensor to pick up vibrations that occur in the electric motor and that are caused by malfunctions of the bearing arrangements, characterized by its configuration as an external-rotor motor, whereby the stator has a bearing support tube that is connected at one end to a ring-shaped stator flange, and bearing arrangements that are arranged at a distance from each other in the bearing support tube in the direction of a center longitudinal axis of the bearing support tube, in which a shaft of the rotor is supported, and the vibration sensor is attached to the stator flange, whereby the vibration sensor is attached directly to a free surface of the stator flange that immediately adjoins the bearing support tube in the radial direction relative to the longitudinal axis, and whereby the stator flange and the bearing support tube are configured in one piece characterized in that the vibration sensor is attached on the side of the stator flange facing away from the rotor.

2. The electric motor according to claim 1, characterized in that the vibration sensor is configured as a vibration rate sensor.

3. The electric motor according to claim 2, characterized in that the vibration rate sensor is a laser-Doppler vibrometer, a MEMS (micro-electro-mechanical system) based on a semiconductor, or else a piezoelectric sensor.

4. The electric motor according to claim 1, characterized in that the bearing support tube is arranged inside the stator laminated core, which has motor windings configured as single-tooth windings.

5. The electric motor according to claim 1, characterized in that, on the stator flange, on the side facing away from the rotor, a partial housing is attached which holds the motor electronics and in which the vibration sensor is accommodated.

6. The electric motor according to claim 1, characterized in that a metal structure-borne sound-conducting element, for example, in the form of a disc, is arranged between the vibration sensor and the stator flange.

7. The electric motor according to claim 6, characterized in that the vibration sensor is connected via a signal cable to evaluation electronics that are arranged on the printed circuit board of the motor electronics.

* * * * *